United States Patent [19]

Ando et al.

[11] Patent Number: 5,382,333

[45] Date of Patent: Jan. 17, 1995

[54] PROCESS FOR PRODUCING COPPER CLAD LAMINATE

[75] Inventors: Kazuhiro Ando; Takamasa Kawakami; Yasuhiro Shouji, all of Ibaraki; Yasuo Tanaka, Tokyo; Takeo Kanaoka, Tokyo; Norio Sayama, Tokyo, all of Japan

[73] Assignee: Mitsubishi Gas Chemical Company, Inc., Tokyo, Japan

[21] Appl. No.: 950,757

[22] Filed: Sep. 24, 1992

Related U.S. Application Data

[63] Continuation-in-part of Ser. No. 737,545, Jul. 30, 1991, abandoned.

[30] Foreign Application Priority Data

Jul. 30, 1990 [JP] Japan .................... 2-199211

[51] Int. Cl.⁶ .................................. C25F 5/00
[52] U.S. Cl. ........................... 204/130; 156/630
[58] Field of Search ............. 156/630; 205/194, 220; 204/130

[56] References Cited

U.S. PATENT DOCUMENTS

| | | | |
|---|---|---|---|
| 4,189,331 | 2/1980 | Roy | 205/101 |
| 4,328,048 | 5/1982 | Senda et al. | 427/79 |
| 4,642,161 | 2/1987 | Akahoshi et al. | 156/630 |
| 4,795,512 | 1/1989 | Nakatani et al. | 156/89 |
| 4,833,004 | 5/1989 | Senda et al. | 148/269 |
| 4,865,948 | 9/1989 | Masumoto et al. | 430/270 |

FOREIGN PATENT DOCUMENTS 0189913 8/1986 European Pat. Off. .
0402966 12/1990 European Pat. Off. .

OTHER PUBLICATIONS

Derwent Abstract of JP-A-61 250 036.

*Primary Examiner*—Kathryn Gorgos
*Assistant Examiner*—Kishor Mayekar
*Attorney, Agent, or Firm*—Sughrue, Mion, Zinn, Macpeak & Seas

[57] ABSTRACT

A process for producing a copper-clad laminate using a copper foil obtained by subjecting the surface of the copper foil to chemical oxidation thereby to form, on the surface, a fine roughness constituted by a copper oxide of a brown to black color and then reducing the copper oxide constituting the fine roughness in an atmosphere in which a reducing gas is present.

1 Claim, 3 Drawing Sheets

PROCESS FOR PRODUCING COPPER CLAD LAMINATE

CROSS-REFERENCE TO THE RELATED APPLICATION

This application is a continuation-in-part application of U.S. patent application Ser. No. 07/737,545, filed Jul. 30, 1991, entitled "Process for producing copper-clad laminate", now abandoned.

FIELD OF THE INVENTION

The present invention relates to a process for producing a copper-clad laminate which is obtained from a copper foil and prepregs by lamination molding, wherein the copper foil is an electrodeposited copper foil or a rolled copper foil and is obtained by treating a surface of the copper foil with an oxidizing aqueous alkaline solution, followed by gas-phase reduction. The copper foil has an excellent adhesion and also has excellent electrical properties because the surface which has undergone the treatment for adhesion has generally a roughness height as small as below 3 $\mu$m with no scattering of roughness height values and the copper foil is substantially copper. In particular, the copper-clad laminate is extremely useful to produce copper-clad laminates for high-frequency or audio use or the like when formation of a roughened surface for adhesion by the process of the present invention is applied to a rolled copper foil or the like.

BACKGROUND OF THE INVENTION

Single-side or double-side copper-clad laminates are usually being manufactured by a process in which an electrodeposited or rolled copper foil which has undergone a surface treatment for adhesion is superposed on prepregs obtained by impregnating a base material such as a woven glass fiber fabric or the like with ah epoxy resin or the like as a matrix resin and drying the impregnated base material, or such prepregs are sandwiched between two such copper foils, and the resulting assembly is lamination molded. Multilayered printed circuit boards having an inner-layer printed circuit are manufactured by a process in which the above copper-clad laminate is combined with an inner-layer board having formed thereon a printed circuit for inner layer use and further with prepregs and either a copper foil or a single-side copper-clad laminate and the resulting assembly is subjected to lamination molding to give a multilayered board both sides of which are constituted by a copper foil, and this multilayered board is subjected to processing steps such as steps for forming through-holes, outer-layer printed circuits, etc.

The most conventional method of the surface treatment for bonding of copper foils is to impart surface roughness by an electrolytic technique. The surfaces of the copper foils thus surface-treated normally have a roughness height of about 3 to 9 $\mu$m, but such a roughness is not preferable particularly from the standpoint of high-frequency characteristics. In addition, there has been a drawback that the adhesive strength of the roughened surfaces is reduced as the roughness height is lowered.

On the other hand, copper foils, particularly rolled copper foils, which have a finely roughened surface layer formed by treatment of the surface with an aqueous solution of an oxidizing agent and is composed of a copper oxide of a black to brown color are known. Since these copper foils have a small surface roughness height, they are suitable for high-frequency uses and other applications. However, they have a drawback that the finely roughened surface layer composed of a black to brown copper oxide is brittle and tend to easily dissolve in acidic aqueous solutions such as hydrochloric acid, sulfuric acid, and the like. Because of this, there is a problem that in the case where multilayered boards produced by lamination molding are processed to form through-holes therein and then subjected to through-hole plating, electroless plating, or subsequent electroplating, the acidic solution penetrates into the copper oxide layer from exposed parts of the layer in the through-hole walls and attacks the copper oxide layer to cause so-called "harrow" or "pink ring", which may impair insulating and other properties, resulting in final printed circuit boards with poor reliability. In addition, there is another drawback that great care should be taken in transporting or handling the surface-roughened copper foils, because of the brittleness of the copper-oxide surface layer.

SUMMARY OF THE INVENTION

The present inventors conducted intensive investigations to overcome the above-described problems by reducing the brown to black copper oxide constituting the fine roughness on the surface of a copper foil in a manner such that the adhesive strength is not substantially impaired, the effect of preventing the occurrence of "harrow" is stably exhibited, and problems concerning waste liquid treatment are not newly posed.

As a result, the present inventors proposed to take a gas-phase reduction method as a theme of study. However, there has been no example of use of a reducing gas in the field of printed circuit boards, and it is well known that such gases generally are combustible and, in some cases, cause explosion accidents. Because of these, it became extremely difficult to pursue the gas-phase reduction method itself in which such a dangerous gas is handled.

Fortunately, however, a preliminary study showed the possibility that the gas-phase reduction method might be extremely useful. Based on this, further studies have been conducted for practical use. As a result, a process for producing a multilayered printed circuit board has been completed. It has further been found that this process is also extremely useful as a method for the surface treatment for adhesion of copper foils. The present invention has been completed based on the above.

Accordingly, an object of the present invention is to provide a process for producing a copper-clad laminate in which the copper foil has good adhesive strength and excellent electrical properties.

The present invention provides a process for producing a copper-clad laminate which is obtained from a copper foil and prepregs by lamination molding, wherein the copper foil is an electrodeposited copper foil or a rolled copper foil and is obtained by treating a surface of the copper foil with an oxidizing aqueous alkaline solution thereby to form, on the surface, a fine roughness constituted by a copper oxide of a brown to black color and then reducing the copper oxide constituting the fine roughness in an atmosphere in which a reducing gas is present, to thereby form a roughened surface for adhesion while the fine roughness is maintained substantially unchanged.

In preferred embodiments of the process of the present invention, the reducing gas is hydrogen, carbon monoxide, or a mixture thereof, or is a gas of a reducing compound, particularly hydrazine gas. In a further preferred embodiment, the reduction is conducted at a temperature of from 100° to 240° C. when the reducing gas is hydrogen, carbon monoxide, or a mixture thereof, and at a temperature of from 60° to 160° C. under a pressure (hydrazine gas pressure or absolute pressure) of from 0.1 to 15 mmHg when the reducing gas is hydrazine.

DETAILED DESCRIPTION OF THE INVENTION

Laminating Materials

Figure 1:
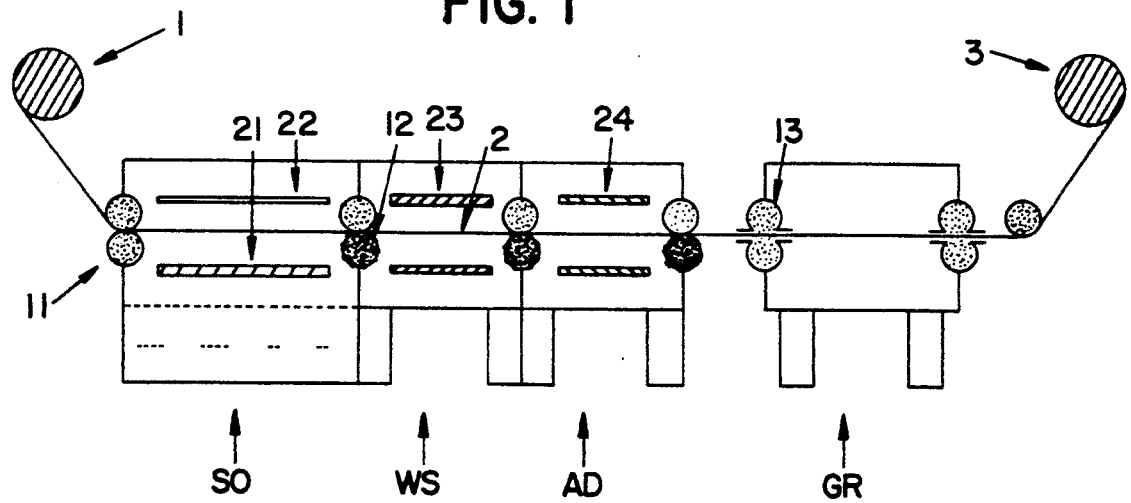
FIG. 1 is a diagrammatic view of an apparatus which can be used to obtain the copper foil used in the process of the present invention.

The copper-clad laminate produced by the process of the present invention is not particularly limited except that the copper foil used therein is an electrodeposited or rolled copper foil which has undergone a surface treatment for adhesion in which a finely roughened layer constituted by a brown to black copper oxide is formed on the surface and then the copper oxide is reduced to copper metal while the finely roughened state is maintained substantially unchanged. Hence, the process of the present invention can be advantageously used to produce various conventional copper-clad laminates including single-side copper clad laminates, double-side copper-clad laminates, copper-clad laminates for inner layer use in multilayered boards, multilayered boards, and others.

Examples of laminating materials for such a laminate include prepregs comprising reinforcing materials (i.e., base materials) and matrix resins.

Examples of the base materials include woven fabrics of various glasses such as E-glass, S-glass, SII-glass, D-glass, quartz glass, and the like, and other inorganic woven fabrics such as alumina paper; woven fabrics made of super heat-resistant resins such as all-aromatic polyamides, polyimides, fluoroplastics, poly(phenylene sulfide), polyetheretherketones, polyetherimides, liquid crystal polyester resins, and the like; woven fabrics obtained using composite yarns comprising combinations of fibers of the above inorganic materials and fibers of the above super heat-resistant resins; and other woven fabrics including those comprising suitable combinations of the above.

Examples of the matrix resins include epoxy resins such as the bisphenol A type, novolac type, halogenated bisphenol A type, and halogenated novolac type and other polyfunctional epoxy compounds having tri- or more functionalities; cyanate ester-based resins such as cyanate resins, cyanate ester-epoxy resins, and cyanate ester-maleimide-epoxy resins; maleimide-based resins obtained mainly from polyfunctional maleimides such as bismaleimide and polyfunctional amines such as bis(4-aminophenyl)methane; and heat-resistant thermoplastic resins and resins comprising blends of thermoplastic resins and thermosetting resins.

Examples of laminating materials further include copper foils such as electrodeposited copper foils and rolled copper foils, double-side or single-side copper-clad laminates obtained from copper foils and prepregs by lamination molding, and printed circuit boards for inner-layer use (inner-layer boards) obtained by forming a printed circuit for inner-layer use on one or both sides of copper-clad laminates. Also usable as laminating materials are flexible copper-clad boards obtained by cladding a copper-foil to films or sheets made of super heat-resistant resins such as polyimides, fluoroplastics, poly(phenylene sulfide), polyetheretherketones, polyetherimides, liquid crystal polyester resins, and others or to films or sheets made of heat-resistant thermoplastic resins or of blends of thermoplastic resins and thermosetting resins.

Lamination molding can be conducted by a conventional method such as platen pressing, platen vacuum pressing, autoclave molding, continuous pressing, or the like, and lamination molding conditions and other conditions can be the same as in conventional methods.

Brown or Black Oxidation Treatment of Copper Foil

In the production of multilayered boards, a method has conventionally been known to convert the surface layer of the copper foil in an inner-layer board into a finely toughened layer of a brown to black copper oxide, i.e., a finely roughened layer in which submicron-order needles, wedges, axes, anchors, and the like mode of a copper oxide are densely present. In general, this method comprises polishing or cleaning the surface of the copper foil of an inner-layer board, subsequently pre-etching (soft-etching or chemically polishing) the copper surface with an aqueous solution of a copper chloride, ammonium persulfate, or the like, and then oxidizing the resulting surface by treating it with an oxidizing aqueous alkaline solution. The same oxidation treatment as above can be used in preparing the copper foil to be used in the process of the present invention. Although such oxidation treatments have conventionally been conducted mainly by an immersion method, a continuous method can also be employed in which the treatment is conducted by spraying as in the spray etching method used, for example, in the formation of printed circuit patterns.

Specific examples of the oxidizing aqueous alkaline solution and treating conditions are as follows, but the treating solution and conditions for the oxidation treatment are not limited to these, and other known methods can be used.

(1) A solution containing sodium hydroxide (NaOH (15 g/l)), sodium hypochlorite (NaOCl (31 g/l)), and sodium phosphate (15 g/l); 70°–100° C., 0.5–10 min.

(2) A solution containing copper sulfate (50 g/l) and sodium chloride (200 g/l); 40°–80° C., 3–15 min.

(3) A solution containing acetic acid (20 g/l), ammonium chloride (20 g/l) and copper acetate (10 g/l); 30°–80° C., 1–10 min.

(4) A solution containing copper acetate (10 g/l), copper sulfate (24 g/l), barium sulfide (24 g/l), and ammonium chloride (24 g/l); 40°–50° C., 1–10 min.

(5) A solution containing copper sulfate (25 g/l), nickel sulfate (25 g/l), and potassium chlorate (25 g/l); 70°–90° C., 1–10 min.

(6) A solution containing potassium persulfate (20 g/l) and sodium hydroxide (50 g/l); 50°–80° C., 1–3 min.

Of the above-described methods for forming a finely toughened surface layer of a brown to black copper oxide, practically employed methods are carried out under conditions so as to produce copper foils which show good adhesive strength when used in laminating for producing multilayered boards, with the finely roughened copper-oxide surface layer being as it is or after the copper oxide is reduced in a liquid phase.

However, since the copper foil having a finely roughened copper-oxide surface layer is used in the present invention after the copper oxide is reduced in a gas phase as being different from conventional processes, it should be noted that the finely roughened copper-oxide surface layer which has the best surface state in terms of adhesive strength or which will have such best surface state after the copper oxide is reduced in a liquid phase does not necessarily have the best surface state even after gas-phase reduction. In other words, even in the case where the copper foil having a finely toughened copper-oxide surface layer is one in which the toughened surface layer is more coarse and brittle as compared with conventional ones and which therefore has poor adhesive strength or causes a trouble that when the copper foil and other laminating materials are laid up, part of the copper oxide falls from the copper foil and adheres to non-printed-circuit parts to foul the parts, or even in the case where the copper foil is one in which, when a laminate is prepared using the copper foil and inner-layer peeling is conducted, the copper oxide remains on the adjacent layer from which the copper foil has been peeled, these copper foils can be made free from such troubles and to have better adhesive strength by reducing the copper oxide to copper metal in a gas phase. Therefore, it is practically important that the copper foil on which a finely roughened copper-oxide surface layer has been formed should be handled continuously without damaging the surface layer.

Reduction

The above-obtained copper foil having on one or both sides thereof a finely roughened surface layer of a brown to black copper oxide is cleaned and then subjected to gas-phase reduction, thereby obtaining a copper foil having a roughened surface layer for adhesion which is made of copper suboxide, copper(I) oxide ($Cu_2O$), or copper metal, particularly copper metal.

Reducing Gas

The atmosphere in which a reducing gas is present and which is used in the gas-phase reduction for producing the copper foil used in the process of the present invention means a gas-phase atmosphere in which a reducing gas such as hydrogen or carbon monoxide, a gas of other gasifiable reducing compound, or the like is present and such a reducing gas may suitably be diluted with a non-oxidizing gas.

Methods for feeding such a reducing gas are not particularly limited. Examples thereof include a method in which hydrogen gas or other gas is fed from a bomb, a method in which a gas is fed through electrolysis or catalytic pyrolysis, a method in which a gas is fed through gasification, and other methods.

Examples of compounds which can be used to generate a reducing gas such as hydrogen or carbon monoxide through catalytic pyrolysis include lower alcohols such as methanol, ethanol, propanol, and butanol; aldehydes and derivatives thereof such as formaldehyde, paraformaldehyde, and trioxane; lower carboxylic acids and esters thereof such as formic acid, its esters, and acetic acid; ammonia and hydrazine; nitrogen-containing lower amines and hydrazine derivatives such as methylamine, ethylamine, diethylamine, and methylhydrazine; metal hydrides and organometallic compounds such as calcium hydride, boron hydride, and methylboron; and the like.

Examples of reducing compounds which can be used after being gasified include hydrazine and its derivatives such as methylhydrazine and the like.

Of these, preferred compounds which generate reducing gases through catalytic pyrolysis are lower alcohols, lower carboxylic acids, and ammonia, and a preferred reducing compound is hydrazine, from the standpoints of easy handling, safety on explosion or when exploded, cost, no generation of harmful wastes, etc.

For the method of feeding a reducing gas through catalytic pyrolysis, a commercially available apparatus can be used, for example, an apparatus for thermally decomposing ammonia. In the case where a reducing compound is fed in a gaseous state, examples of methods therefor include a method in which hydrazine is gasified by heating and this gas is fed after being mixed with a non-oxidizing gas, such as nitrogen, heated to a predetermined temperature; a method in which hydrazine is atomized into a non-oxidizing gas, such as nitrogen, heated to a predetermined temperature to thereby gasify the hydrazine, and the resulting gaseous mixture is fed as it is; a method in which while a non-oxidizing gas is kept being circulated through the inside and outside of the treating chamber, gasified or ungasified hydrazine is fed to the circulating gas; and the like.

Reducing Conditions

The temperature, treating time, and other conditions for the reduction are suitably selected according to the kind and amount (absolute or partial pressure) of the reducing gas used, the presence or absence of a platinum group metal catalyst, and other factors.

In the case of using a gas, such as hydrogen, which has a low reducing ability at room temperature, the treating temperature is suitably selected from the range of from 80° to 300° C. preferably from 100° to 240° C. and the treating time from the range of from 30 seconds to 24 hours, preferably from 1 to 30 minutes. In the case of using a compound, such as hydrazine, which has a sufficient reducing ability even at room temperature, the treating temperature is suitably selected from the range of from 200° C. to room temperature, preferably from 60° to 160° C. and the treating time from the range of from 30 seconds to 3 hours, preferably from 1 to 30 minutes, more preferably from 2 to 10 minutes.

In particular, in the case of using hydrazine gas, there are cases where even though the atmosphere itself is gas-phase, the reduction reaction proceeds in a liquid film formed by the condensation of part of the hydrazine gas on the finely roughened copper-oxide surface layer or formed when water resulting from the reduction reaction remains on the surface without gasifying. Such liquid film formation is more apt to occur when the reduction reaction is conducted at a high rate. However, if such a liquid film is formed on the copper foil surface, migration of copper element occurs and the finely roughened structure of the copper-oxide surface layer is destroyed and, as a result, the copper foil obtained through such reduction has poor adhesive strength. It is therefore preferred to regulate the partial pressure of hydrazine gas or water vapor at a value as low as 50% or less, preferably 20% or less, more preferably 5% or less, of the saturated vapor pressure at the treating temperature. In particular, it is preferred that the reduction treatment is conducted under a pressure (partial or absolute pressure) of from 0.1 to 15 mmHg. It is also preferable that blowing or agitation be conducted to promote gasification so as to prevent the water yielded by the reduction reaction from condensing to form a liquid film on the copper surface. Further, in the case of using hydrazine in particular, since a non-oxidizing gas is required to use in a large quantity, it is particularly preferred to circulate the non-oxidizing gas.

In conducting the above reduction, the degree of reduction can be selected in the range of from the completely reduced state to the half reduced state in which the copper(II) oxide has been mostly reduced into copper(I) oxide, by suitably selecting reduction conditions. Generally, however, it is preferred to conduct the reduction until the copper oxide is reduced into copper metal.

Post-Treatment After Reduction

The finely roughened surface layer in which the copper oxide has been thus reduced preferably to copper metal has finer roughness than the finely roughened copper-oxide surface layer. Because of the exceedingly large surface area of the especially finely roughened surface layer, the copper foil tends to be oxidized, so that the copper constituting the finely roughened surface layer is apt to be changed into a copper oxide during storage, etc., and this may result in an impaired adhesive strength.

Therefore, rust prevention treatment is preferably conducted to prevent oxidation, thereby permitting easy storage. Although rust prevention treatment of the copper foil may be performed by treating the copper foil with an aqueous solution of a conventional rust preventive immediately after the copper foil is taken out of the reducing chamber, gradual oxidation employing no liquid phase is particularly preferred as the post-treatment of the copper foil used in the process of the present invention. This gradual oxidation can be easily practiced by treating the copper foil by exposing it to an atmosphere normally having a partial oxygen pressure of several mmHg and a temperature of about 120° C. or more. Such an atmosphere is produced in the reducing chamber by removing, after the reduction, the remaining reducing gas substantially completely and then introducing a slight amount of oxygen before the temperature in the chamber decreases.

Reducing Apparatus

Apparatuses for conducting the above-described gas-phase reduction for producing the copper foil used in the process of the present invention are explained below.

It should first be noted that a reducing gas is handled which usually is unfamiliar in the fields where the present invention is involved. In this respect, the apparatus to be used should be designed so as to be free from inclusion of air into the reducing chamber (system) or gas leakage. It is further necessary that a transferring means, other devices, and other solid substances do not come into contact with the copper foil on which a finely toughened copper-oxide surface layer has been formed.

An apparatus for conducting the gas-phase reduction basically comprises a reducing chamber, a reducing gas-feeding device (equipment), and an inert gas-feeding device or a treating device for circulation and reuse of an inert gas. According to need, the apparatus further comprises, as auxiliary equipment, a waste gas-treating device, a device for feeding a copper foil to the reducing chamber and withdrawing it from the chamber, a control device for controlling these devices, and the like. Although the apparatus can be suitably designed for continuous, batch-continuous, or batch processing, it is particularly preferred to use a copper foil in continuous form and to process the same in a continuous manner. It is also particularly preferred that the apparatus be so designed that all the devices, including a device for the formation of a finely toughened copper-oxide layer and a device for reduction, have been united and a copper foil in continuous form is processed therein continuously. The pressure for each processing step can be suitably selected from reduced, atmospheric, and elevated pressures, but atmospheric pressure is advantageous from the standpoint of easy operation.

A preferred continuous processing method can be easily practiced using an apparatus in which mixing of a reducing gas with the air is prevented by means of a gas flow curtain formed by providing, at the inlet and outlet of the reducing chamber, an inert gas-introducing part for introducing an inert gas pressurized to a value slightly higher than ordinary pressure and further providing a slit on both sides of each of the gas-introducing parts. For use in this shielding part, the following techniques and devices, for example, are described: rolls and belts having surfaces which do not damage a finely roughened copper-oxide layer are used and they are revolved or moved at a speed equal to the traveling speed of copper foil; rolls and belts are made to be easily floated by means of a pressure difference as small as that produced by an introduced inert gas, by significantly reducing the weights of the rolls and belts and providing, at the edges thereof, a curtain which functions as a soft edge-dam; continuously porous rolls are used after their surface parts other than those to be in contact with or close to a copper foil are sealed, and blowing of an inert gas into the reducing chamber is conducted through the unsealed pores; and rolls in which their surface layer is made of an air bag or the like having an inner pressure about several mmHg higher than the atmospheric pressure are used.

A specific example of the apparatus for treating a copper foil is explained with reference to the accompanying drawings.

Figure 2:
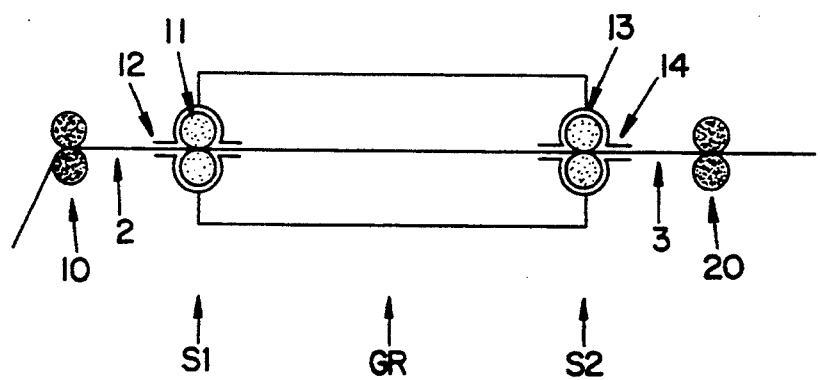
FIG. 2 is a diagrammatic view of the reducing part of the above apparatus.
Figure 3:
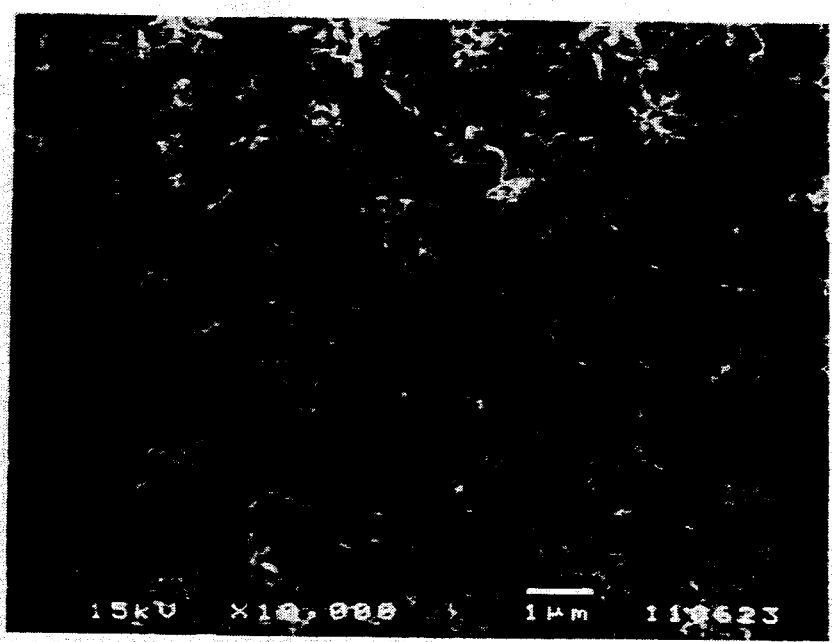
FIGS. 3 to 6 each is a scanning electron micrograph showing the state of copper foil surfaces before and after reduction treatment.
Figure 4:
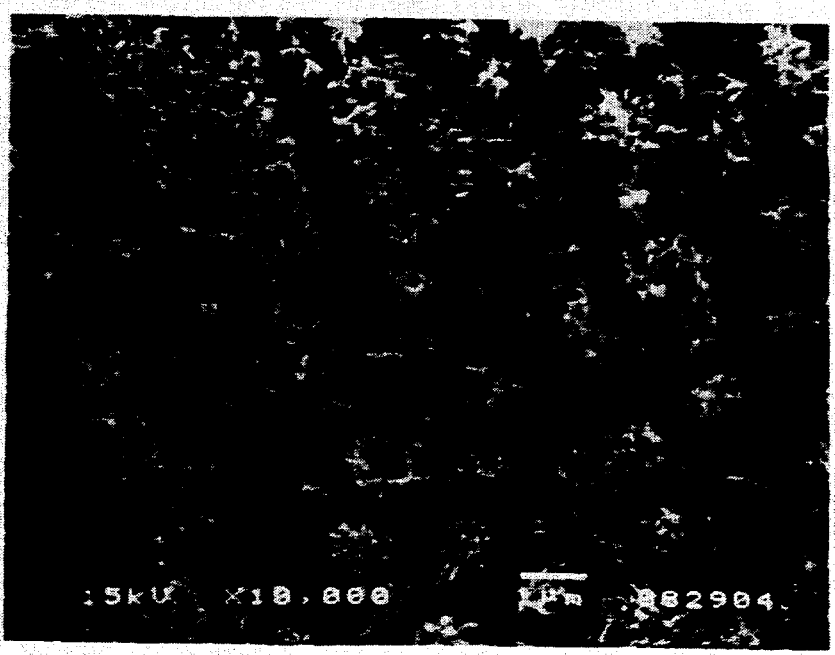
Figure 5:
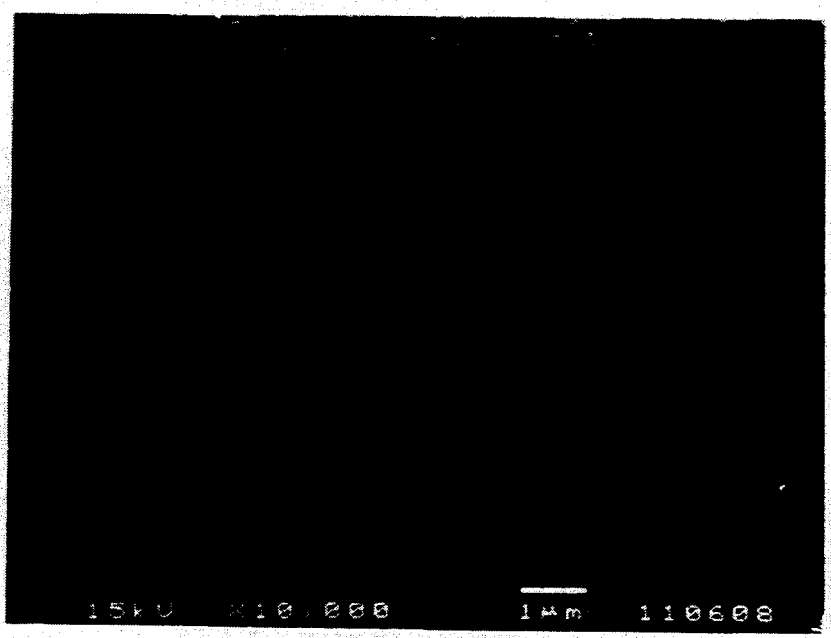
Figure 6:
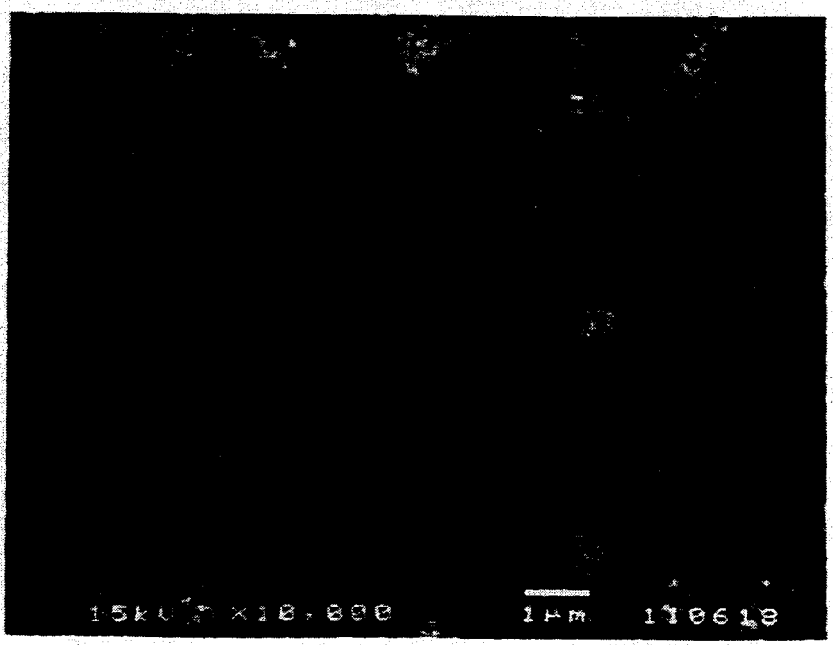

FIG. 1 is a diagrammatic view of an apparatus for oxidizing a continuous copper foil to form a finely toughened copper-oxide layer, cleaning and drying the resulting copper foil, and then continuously reducing the copper oxide. FIG. 2 shows the reducing part of the above apparatus.

In the apparatus of FIG. 1, a continuous copper foil 1 is introduced into an oxidizing chamber SO, and an oxidizing liquid is sprayed normally at a low pressure with a sprayer 21 from the lower side of the copper foil 1, thereby to form a finely toughened copper-oxide layer on the lower surface of the copper foil 1. It is preferred that this spraying be conducted while air is kept being blown onto the upper surface of the copper foil 1 by means of an air sprayer 22 so as to prevent the oxidizing liquid from moving to the upper side of the copper foil 1. The resulting copper foil, i.e., a copper foil 2 having a copper oxide layer on the lower side, is introduced through an air-bleed roll 12 into a water-washing chamber WS, where the copper foil 2 is water-washed by means of a water sprayer 23. The washed copper foil 2 is dried in an air-flow drying chamber AD by a dried hot air-blowing means 24. Subsequently, the copper foil 2 travels through a sealing part comprising a set of gas-bleed rolls 13 and enters into a reducing chamber GR, where the copper oxide is reduced. The resulting copper foil is taken out through a sealing part comprising another set of gas-bleed rolls 13.

With reference to FIG. 2, the reducing step is explained in greater detail. The continuous copper foil 2, on which a finely toughened copper-oxide layer has been formed and which has been dried, passes through air-bleed rolls 10 for guiding and is then introduced into an introducing part S1. This introducing part S1 serves to shield a reducing chamber GR from the outside by means of a non-oxidizing gas. In this device as shown in FIG. 2, an orifice part 12 is provided on both sides of non-oxidizing gas-bleed rolls 11. Since the finely roughened copper-oxide surface layer on the copper foil used in the process of the present invention is usually extremely brittle, there is the possibility that the finely roughened structure might be destroyed even when soft rolls or the like are used. For this reason, the rolls 10 and 11 are designed so as not to come into direct contact with the finely roughened copper oxide layer. The copper oxide constituting the finely roughened copper oxide layer on the copper foil 2 introduced into the reducing chamber GR is reduced in the chamber to give a finely roughened copper metal layer. Thereafter, the resulting copper foil is taken out from a withdrawal part S2 comprising non-oxidizing gas-bleed rolls 13 and orifice parts 14 provided on both sides of the rolls 13, and is then passed through guide rolls 20 at the outlet. After the treated surface is covered with a protective film or the like, the thus-treated copper foil is suitably cut, or wound up for use in continuous processes for producing copper-clad laminates. Alternatively, the treated copper foil is suitably cut into predetermined sizes for use in the process of the present invention for producing a single-side, double-side, or multilayered copper-clad laminate.

Advantages of the Reduction

The gas-phase reduction for producing the copper foil used in the process of the present invention is conducted under conditions which are substantially the same as those for drying, except that a reducing-gas atmosphere is used. Therefore, the drying step after the oxidizing step can be replaced with the reducing step and, in this respect, the treating process is extremely rational.

Further, the above-described gas-phase reduction is substantially free from such problems concerning waste liquid treatment as in the liquid-phase reduction. For example, in the case where a toxic gas such as carbon monoxide is used in the waste gas, it is sufficient that the waste gas discharged from the reducing apparatus is introduced into a catalytic combustor, where the reducing gas remaining unreacted is converted to carbon dioxide or water according to the starting reducing gas. In the case of hydrazine, removal or recovery of hydrazine from the waste gas can be easily attained through condensation by cooling, absorption by water, etc., and the recovered hydrazine is reusable.

From the standpoints of safety and others, the smaller the amount of combustible or explosive gases handled or stored, the better.

Fortunately, the amount of a reducing gas required for the reduction to produce the copper foil used in the present invention is extremely small as compared with those of ordinarily used industrial gases. Illustratively stated, assuming that a finely roughened copper oxide layer having an average thickness of 2 $\mu$m, which is an excessively large evaluation, and having an area of 5,000 $m^2$ is treated, the required reducing gas amount is about 18 $Nm^3$ in the case of hydrogen. Therefore, there is no need of stocking a large quantity of gas, and feeding of a reducing gas can be very easily accomplished, for example, by means of a commercially available hydrogen-evolving device which on-site generates a required amount of hydrogen through the decomposition of ammonia. In the case of hydrazine, hydrazine hydrate may also be used advantageously and, further, in a reducing system in which hydrazine hydrate is present at a partial pressure of 0.01 mmHg or more, preferably in the range of from 0.1 to 15 mmHg, the reduction reaction can be completed within a practical period of time. This means that the reducing atmosphere can be produced by merely mixing such a small amount of hydrazine hydrate gas, for example, with nitrogen gas having atmospheric pressure. Therefore, the partial pressure of hydrazine gas is far below the explosion limit, so that the reduction can be carried out under conditions which do not cause an explosion even if gas leakage occurs.

Surface State Before and After Reduction

The states of the copper foil surfaces before and after the reduction are explained by reference to scanning electron micrographs I to IV shown in FIGS. 3 to 6, respectively.

Photograph I

Surface of finely toughened copper oxide layer.

Photograph II

Surface of finely roughened layer which has undergone hydrogen reduction treatment.

Conditions: 180° C. 3 hr, atmospheric pressure, hydrogen gas 100%.

Photograph III

Surface of finely roughened layer which has undergone hydrazine reduction treatment.

Conditions: 120° C. 30 min atmospheric pressure, gas flow 0.085 m/sec, $N_2H_4.H_2O$ concentration in nitrogen gas 0.15 vol %.

Photograph IV

Surface of finely toughened layer which has undergone hydrazine reduction treatment in which a liquid film is presumed to have been formed on the surface.

Conditions: 40° C., 30 min, atmospheric pressure, gas flow 0.085 m/sec, $N_2H_4.H_2O$ concentration in nitrogen gas 0.34 vol %, water 0.7 vol %.

Photograph I shows that the finely toughened copper oxide layer is in the state in which copper-oxide projections in the shape of submicron-order or smaller needles, short fibers, whiskers, or wedges are densely present. The gas-phase reduction of this copper oxide into copper metal gives the finely toughened layer as shown in photographs II and III. Although the projections in the finely roughened layer after the reduction (photographs II and III) seem to have become little more slender, such a change cannot substantially be recognized at a glance. In the above-described gas-phase reduction, the finely roughened copper oxide layer can be converted to a finely roughened layer made of copper metal having greatly enhanced strength and toughness and in which the roughness has contracted by a degree corresponding to the elimination of oxygen, while the finely roughened state of the copper oxide layer being maintained substantially unchanged. It can be understood from the above that even in the case of a copper foil having a finely roughened copper oxide surface layer which has a large roughness and is brittle as compared with conventional copper foils and, hence, shows poor adhesive strength, it can be made advantageously usable by reducing the copper oxide into copper metal to thereby increase the adhesive strength.

From Photograph IV, it can also be understood that under conditions which result in formation of a liquid film or the like on the copper surface (e.g., high-rate reduction at a relatively low temperature or reduction using a gas flow which is too low for the reduction rate), the finely roughened state of the copper-oxide layer is destroyed and accumulation of fine particles and the like occur and, as a result, the resulting copper foil has severely impaired adhesive strength.

Production of Copper-Clad Laminate

Like conventional copper foils, the copper foil which has thus undergone the gas-phase reduction can be used in the process of the present invention. That is, the copper foil is used, as it is or after being cut into a predetermined size, in lamination molding to produce a copper-clad laminate or double-side copper-clad multilayered board, from which a printed circuit board is manufactured through printed-circuit formation and other processing steps. Lamination molding conditions and other conditions are suitably selected according to the laminating materials used.

Effects of the Invention

As described above and as will be demonstrated by the Example given below, copper-clad laminates produced by the process of the present invention are characterized in that the copper foil used has a fine surface roughness and excellent adhesive strength as compared with conventional copper foils treated for adhesion.

Further, multilayered boards manufactured using such copper-clad laminates as inner-layer boards are substantially completely free from occurrence of "harrow" which is formed by the dissolution of a brown to black copper oxide into a plating solution and which tends to cause defects such as electrical short-circuits.

Since the device for conducting the reduction treatment of a copper foil can also be used to conduct a conventional drying step, modification of an existing copper foil-treating line is not so costly. To scale up the treating line is also extremely easy because the reduction is conducted in a gas phase and the treating temperature can be selected freely according to the reduction state only.

Furthermore, since the reducing gas used for producing the copper foil used in the process of the present invention can be obtained by electrolysis, catalytic pyrolysis, or the like, there is no need of stocking a combustible or even explosive gas in a large quantity. A further advantage of the reduction treatment is that the process itself causes no environmental pollution because the wastes resulting from the reduction treatment are gaseous and the reducing gas remaining unreacted after the treatment can be very easily removed by catalytic combustion or other means while the toxicity and other properties of the gas are suitably taken in account.

The most important feature of the gas-phase reduction treatment for producing the copper foil used in the present invention resides in that the reduction-treated copper foil has exceedingly good properties including enhanced adhesive strength, although examination of the finely roughened surface state of this copper foil at least with a microscope or scanning electron microscope revealed that even where the copper oxide is ascertained by X-ray fluorescence spectroscopy (It was impossible to ascertain with conventional X-ray diffraction or IR) to have been completely reduced to copper metal, the appearance of the surface is substantially the same as that of the finely roughened surface which has undergone oxidation treatment for adhesion and if the reduction-treated surface is examined carefully, the projections are found to have undergone a slight change, i.e., they have become slightly slender.

To sum up, the process for producing a copper-clad laminate according to the present invention has high reliability and high production efficiency and causes no environmental pollution. Therefore, the process is of considerable industrial significance.

The present invention is explained in more detail by reference to the following example, which should not be construed as limiting the scope of the invention.

EXAMPLE

A rolled copper foil having a thickness of 35 μm was treated at 95° C. for 5 minutes with an aqueous solution of 15 g/l NaOH, 31 g/l sodium hypochlorate, and 15 g/l sodium phosphate, and then washed with water, thereby obtaining a double-side black oxidation-treated copper foil.

On the other hand, two rolled copper foils each having a thickness of 18 μm were superposed tightly on each other and the edges were heat-sealed with a hot-melt adhesive film. The thus-joined copper foils were subjected to black oxidation treatment under the same conditions as the above and then washed with water. Subsequently, the hot-melt adhesive film sealing was removed, thereby obtaining two single-side black oxidation-treated copper foils.

The single-side and double-side black oxidation-treated copper foils were placed in a drying chamber capable of being evacuated, and dried at 150° C. for 10 minutes under atmospheric pressure. Subsequently, while the temperature was kept being raised, the drying chamber was evacuated, nitrogen gas was then introduced thereinto, the chamber was evacuated again, and then hydrogen gas was introduced and reduction treatment was conducted at 220° C. for 10 minutes. Thereafter, the drying chamber was evacuated, nitrogen gas was introduced thereinto to cool the chamber, and then the reduction-treated copper foils were taken out.

Through this reduction treatment of the black oxidation-treated copper foils, the surface layers turned light brown and the copper oxide was reduced to Cu substantially completely.

Three sheets of glass-epoxy prepreg (resin content 52%, thickness 0.2 mm) were superposed on one another and sandwiched between two sheets of the above-obtained double-side reduction-treated copper foil. This assembly was sandwiched between triacetyl cellulose films as protective sheets and subjected to lamination molding at a temperature of 175° C. and a pressure of 40 kg/cm$^2$ for 2 hours, thereby obtaining a copper-clad laminate.

On this copper-clad laminate, striped patterns with copper foil portions each stripe having a width of 10 mm were formed by a conventional method. This laminate was sandwiched between three sheets of glass-epoxy prepreg (resin content 52%, thickness 0.2 mm) and three sheets of the same prepreg, and this assembly was further sandwiched between two sheets of the above-obtained single-side reduction-treated copper foil. The resulting assembly was subjected to lamination molding at a temperature of 175° C. and a pressure of 40 kg/cm$^2$ for 2 hours, thereby obtaining a multilayered board having four copper layers with two of these as the outermost layers.

The peel strength of the inner-layer copper foils in the thus-obtained multilayered board was measured, and found to be 1.0–1.1 kg/cm.

With respect to the remaining portion of the multilayered board, drilling was conducted to form 1,000 holes at intervals of 2.54 mm under conditions of 0.4 mm hole diameter, 80,000 r.p.m., and 20 μm per revolution. The drilled four-layer board was immersed in 4N aqueous HCl solution for 5 minutes, and then arbitrary one fourth (250) of all the holes were examined for harrow in hole-surrounding parts under which an inner-layer copper foil was present. As a result, no harrow was observed.

While the invention has been described in detail and with reference to specific embodiments thereof, it will be apparent to one skilled in the art that various changes and modifications can be made therein without departing from the spirit and scope thereof.

What is claimed is:

1. A process for producing a copper-clad laminate which comprises placing a (i) copper foil on (ii) prepregs to form an assembly and lamination molding the resulting assembly, wherein the (i) copper foil is an electrodeposited copper foil or a rolled copper foil and is obtained by treating a surface of a (iii) starting copper foil with an oxidizing aqueous alkaline solution to thereby form, on the surface of the (iii) starting copper foil, a fine roughness constituted of a copper oxide of a brown to black color and then reducing the copper oxide which constitutes the fine roughness in an atmosphere in which hydrazine as a reducing gas is present, to thereby form a roughened surface for adhesion while the fine roughness is maintained substantially unchanged, wherein said reducing is conducted at a temperature of from 60° to 160° C. under a hydrazine gas pressure of from 0.1 to 15 mmHg.

* * * * *